US007315625B2

(12) United States Patent
Iwasaki et al.

(10) Patent No.: US 7,315,625 B2
(45) Date of Patent: Jan. 1, 2008

(54) SOUND APPARATUS, METHOD OF CHANGING SOUND CHARACTERISTICS, AND DATA RECORDING MEDIUM ON WHICH A SOUND CORRECTION PROGRAM

(75) Inventors: Akira Iwasaki, Kawagoe (JP); Momotoshi Furunobu, Kawagoe (JP)

(73) Assignee: Pioneer Corporation, Tokyo-to (JP)

( * ) Notice: Subject to any disclaimer, the term of this patent is extended or adjusted under 35 U.S.C. 154(b) by 347 days.

(21) Appl. No.: 10/743,025

(22) Filed: Dec. 23, 2003

(65) Prior Publication Data

US 2004/0136540 A1 Jul. 15, 2004

(30) Foreign Application Priority Data

Dec. 26, 2002 (JP) ............................ 2002-378209

(51) Int. Cl.
*G06F 17/00* (2006.01)
*H04R 29/00* (2006.01)
*H03G 3/00* (2006.01)

(52) U.S. Cl. ........................ 381/104; 381/59; 381/107; 381/58; 381/104; 700/94

(58) Field of Classification Search .................. 381/59, 381/107, 104, 57, 58, 103, 108, 96, 98; 700/94
See application file for complete search history.

(56) References Cited

U.S. PATENT DOCUMENTS 4,622,691 A * 11/1986 Tokumo et al. ............... 381/86
5,138,665 A * 8/1992 Ito ............................ 381/104
5,146,507 A * 9/1992 Satoh et al. .................. 381/97
5,172,417 A * 12/1992 Iwamura ...................... 381/103
5,255,323 A * 10/1993 Ishihara et al. ............. 381/103
6,501,843 B2 * 12/2002 Usui et al. .................. 361/302
6,961,438 B1 * 11/2005 Fujita ......................... 381/182
2003/0086577 A1 * 5/2003 Lee ............................ 381/97

FOREIGN PATENT DOCUMENTS

JP 06232662 A * 8/1994
JP 2000-217197 8/2000
JP 2000217197 A * 8/2000

* cited by examiner

*Primary Examiner*—Vivian Chin
*Assistant Examiner*—Devona E. Faulk
(74) *Attorney, Agent, or Firm*—Young & Thompson

(57) ABSTRACT

This invention is a sound apparatus having a plurality of different kinds of speakers and that independently performs correction of the sound signal for each speaker to obtain optimum sound and sound field. This sound apparatus has an output device that receives audio signals and outputs sound, and comprises: a correction device for correcting the audio signals that are input to each of the output devices; and a correction-characteristic-setting device which sets correction characteristic for each of the output devices; and where the correction device correct the audio signals based on the set correction characteristic.

19 Claims, 6 Drawing Sheets

SOUND APPARATUS, METHOD OF CHANGING SOUND CHARACTERISTICS, AND DATA RECORDING MEDIUM ON WHICH A SOUND CORRECTION PROGRAM

BACKGROUND OF THE INVENTION

1. Field of the Invention

This invention relates to a sound apparatus, method of changing sound characteristics and a data-recording medium on which a sound-correction program.

2. Description of the Related Art

Conventionally, even in the case of having a plurality of output channels such as speakers of a car audio system, for example, the same correction operation using the same correction circuit was performed for the plurality of output channels, and then the audio signal was sent to the plurality of speakers and the sound was output.

However, of sound apparatuses having speakers, there are sound apparatuses that can correct the delay time for each transmission path (for example, refer to Japanese Laid-Open patent application no. 2000-217197).

In the case of the conventional technology constructed as described above, there was a problem in that a correction operation, such as removal of the low-frequency sound, was performed by a correction circuit even though distortion did not occur in the output from a speaker having excellent low-frequency reproduction capability, such as a in the case of a large-diameter speaker. Also, when a correction circuit was used that was suitable for a speaker with excellent reproduction capability, there was a problem in that a correction operation, such as sufficient removal of the low-frequency sound in a speaker having poor low-frequency reproduction capability, such as a small-diameter speaker, was not performed, and the output became distorted.

SUMMARY OF THE INVENTION

The object of the present invention is to provide a sound apparatus that is capable of outputting proper sound and sound field from each speaker even when there is a plurality of different kinds of speakers.

(1) The above object of the present invention can be achieved by a sound apparatus provided with: output device that receive audio signals and output sound, and comprises: a correction device which corrects the audio signals that are input to each of the output devices; and a correction-characteristic-setting device which sets a correction characteristic for each of the output devices based on the reproduction capability of each of the output devices; and wherein the correction device corrects the audio signals based on the set correction characteristic.

According to the present invention, it is possible to independently correct the audio signals that are sent to the speakers according to the reproduction capability of each speaker, so even in the case of a car audio system having a plurality of speakers, it is effective in making it possible to obtain optimum sound output and optimum sound field.

(2) In one aspect of the present invention, in the sound apparatus, the correction-characteristic-setting device sets the correction characteristic based on the volume of the sound output from the output device.

According to the present invention, when the volume level from a speaker is greater than a level that was preset according to the low-frequency reproduction capability of that speaker, correction is performed on the audio signal sent to the speaker, and since correction is only performed when correction results can be expected, it is effective in making it possible to obtain more optimum sound output.

(3) In another aspect of the present invention, in the sound apparatus, the correction-characteristic-setting device detects the level of the correction-frequency range for which the correction process will be performed from the audio signal input to the output device, and sets the correction characteristic based on the detected level of the correction-frequency range.

According to the present invention, it is possible to perform the correction operation according to the low-frequency reproduction capability of the speaker.

(4) In a further aspect of the present invention, in the sound apparatus, the reproduction capability of the output device is the low-frequency reproduction capability.

According to the present invention it is possible to perform the correction operation even though the speaker has poor low-frequency reproduction capability.

(5) In a further aspect of the present invention, in the sound apparatus, the correction device comprises subtraction circuits that use a low-pass filter having the correction characteristic.

According to the present invention, by using simple operation circuits, it is possible to obtain even more optimum sound output.

(6) In a further aspect of the present invention, in the sound apparatus, the correction device comprises a high-pass filter having correction characteristic.

According to the present invention, by using simple operation circuits, it is possible to obtain even more optimum sound output.

(7) In a further aspect of the present invention, the sound apparatus comprises a plurality of output device, wherein the correction device and the correction-characteristic-setting device comprises located in each of output devices.

According to the present invention, it is possible to provide a sound apparatus that is capable of outputting optimum sound and an optimum sound field from each speaker even when there is a plurality of different kinds of speakers.

(8) The above object of the present invention is a sound apparatus that changes the characteristics of an input audio signal and outputs the changed audio signal to first and second output devices, comprises: a first detection device that detects an adjustment value of a volume-adjustment device that adjusts the volume of the audio signal; a distribution device that divides and distributes the audio signal to the first and second output devices; a memory device that stores first data according to the reproduction capability of the first output device, and stores second data according to the reproduction capability of the second output device; a first change device that changes the frequency characteristic of the first audio signal that was distributed to the first output device based on the first data; a second change device that changes the frequency characteristic of the second audio signal that was distributed to the second output device based on the second data; and a control device that performs control to operate the first and second change devices when the adjustment value of the volume-adjustment devices is larger than the first adjustment value.

According to the present invention, it is possible to independently correct audio signals that are sent to the speakers according to the reproduction capability of each speaker, so even when there is a plurality of speakers such as in a car audio system, it is possible to obtain optimum sound output and optimum sound field.

(9) In one aspect of the present invention, in the sound apparatus, the control device performs control such as not to operate the first and second change devices when the adjustment value of the volume-adjustment device is less than the first adjustment value, and to operate the first and second change devices when the adjustment value of the volume-adjustment device is greater than the first adjustment value.

According to the present invention, the correction process is performed only when the correction effect can be expected, so it is possible to obtain even more optimum sound output.

(10) The above object of the present invention is a sound apparatus that changes the characteristics of an input audio signal and outputs the changed audio signal to first and second output devices, comprises: a second detection device that detects the signal level of a specified frequency bandwidth of the audio signal; a distribution device that divides and distribute the audio signal to the first and second output devices; a memory device that stores first data according to the reproduction capability of the first output device, and stores second data according to the reproduction capability of the second output device; a first change device that changes the frequency characteristic of the first audio signal that was distributed to the first output device based on the first data; a second change device that changes the frequency characteristic of the second audio signal that was distributed to the second output device based on the second data; and a control device that performs control to operate the first and second change devices when the adjustment value of the volume-adjustment device is larger than the first adjustment value.

According to the present invention, it is possible to independently correct audio signals that are sent to the speakers according to the reproduction capability of each speaker, so even when there is a plurality of speakers such as in a car audio system, it is possible to obtain optimum sound output and optimum sound field.

(11) In one aspect of the present invention, the sound apparatus comprises a first detection device that detects the adjustment value of the volume-adjustment device that adjusts the volume of the audio signal, wherein the control device performs control to operate the first and second change devices when the adjustment value of the volume-adjustment device is greater than the first adjustment value, and the signal level is greater than a first specified value.

According to the present invention, correction of the audio signal sent to a speaker is performed only when the volume level from the speaker is greater than a level that is preset according to the low-frequency reproduction capability of that speaker, so the correction process is performed only when the correction effect can be expected, and thus it is possible to obtain even more optimum sound output.

(12) In another aspect of the present invention, in the sound apparatus, the control device performs control such as not to operate the first and second change device when the adjustment value of the volume-adjustment device is less than the first adjustment value, or when the signal level is less than the first specified value.

According to the present invention, correction of the audio signal sent to a speaker is performed only when the volume level from the speaker is greater than a level that is preset according to the low-frequency reproduction capability of that speaker, so the correction process is performed only when the correction effect can be expected, and thus it is possible to obtain even more optimum sound output.

(13) In a further aspect of the present invention, the sound apparatus comprises a first detection device that detects the adjustment value of a volume-adjustment device that adjusts the volume of an audio signal; wherein the memory device further stores a second and third adjustment value according to both the first and second data; wherein the control device performs control such that it operates the first change device when the signal level is greater than the first specified value and the adjustment value of the volume-adjustment device is greater than the second adjustment value, and operates the second change device when the signal level is greater than the first specified value and the adjustment value of the volume-adjustment device is greater than the third adjustment value.

According to the present invention, it is possible to provide a sound apparatus that is capable of outputting optimum sound and optimum sound field from each speaker even when there is a plurality of different kinds of speakers.

(14) In a further aspect of the present invention, in the sound apparatus, the control device performs control such that it does not operate the first and second change devices when the signal level is less than the first specified value.

According to the present invention, correction of the audio signal sent to a speaker is performed only when the volume level from the speaker is greater than a level that is preset according to the low-frequency reproduction capability of that speaker, so the correction process is performed only when the correction effect can be expected, and thus it is possible to obtain even more optimum sound output.

(15) In a further aspect of the present invention, in the sound apparatus, the second adjustment value is the adjustment value of the volume-adjustment device that is set based on the low-frequency reproduction capability of the first output device, and the third adjustment value is the adjustment value of the volume-adjustment device that is set based on the low-frequency reproduction capability of the second output device.

According to the present invention, it is possible to provide a sound apparatus that is capable of outputting optimum sound and optimum sound field from each speaker even when there is a plurality of different kinds of speakers.

(16) In a further aspect of the present invention, in the sound apparatus, the specified frequency bandwidth is a low-frequency bandwidth that is less than a first specified frequency, the first data is a first low-frequency-removal characteristic that is set based on the low-frequency-reproduction capability of the first output device, the second data is a second low-frequency removal characteristic that is set based on the low-frequency-reproduction capability of the second output device, the first change device is a first low-frequency-removal device which removes the low frequency based on the first low-frequency-removal characteristic, and the second change device is a second low-frequency-removal device which removes the low frequency based on the second low-frequency-removal characteristic.

According to the present invention, it is possible to perform the correction operation according to the low-frequency-reproduction capability of the speaker.

(17) In a further aspect of the present invention, in the sound apparatus, the first and second change devices each use a low-pass filter having a frequency characteristic based on the first and second data, respectively.

According to the present invention, by using simple operation circuits, it is possible to obtain even more optimum sound output.

(18) In a further aspect of the present invention, in the sound apparatus, the memory device detects the low-frequency-reproduction capability of the first output device by collecting the output from the first output device when pink noise is input to the first output device, and stores first data that was found based on the low-frequency-reproduction capability of the first output device; and detects the low-frequency-reproduction capability of the second output device by collecting the output from the second output device when pink noise is input to the second output device, and stores second data that was found based on the low-frequency-reproduction capability of the second output device.

According to the present invention, it is possible to provide a sound apparatus that is capable of outputting optimum sound and optimum sound field from each speaker even when there is a plurality of different kinds of speakers.

(19) The above object of the present invention is a sound-characteristics-change method that changes the characteristics of an input audio signal and outputs the changed audio signal to first and second output processes, comprising: a first detection process of detecting the adjustment value of a volume-adjustment process that adjusts the volume of the audio signal; a second detection process of detecting the signal level of a specified frequency bandwidth of the audio signal; a distribution process of dividing and distributing the audio signal to the first and second output processes; and a change process of changing the frequency characteristic of the first audio signal that was distributed to the first output process based on the first data that was set according to the low-frequency-reproduction capability of the first output process, as well as changing the frequency characteristic of the second audio signal that was distributed to the second output process based on the second data that was set according to the low-frequency-reproduction capability of the second output process, when the adjustment value of the volume-adjustment process is greater than the first adjustment value and the signal level is greater than the first specified value.

According to the present invention, it is possible to independently correct audio signals that are sent to the speakers according to the reproduction capability of each speaker, so even when there is a plurality of speakers such as in a car audio system, it is possible to obtain optimum sound output and optimum sound field.

(20) The above object of the present invention is a sound-characteristics-change method that changes the characteristics of an input audio signal and outputs the changed audio signal to the first and second output processes, comprising: a first detection process of detecting the adjustment value of a volume-adjustment process that adjusts the volume of the audio signal; a second detection process of detecting the signal level of a low-frequency bandwidth that is less than a first specified frequency of the audio signal; a distribution process of dividing and distributing the audio signal to the first and second output processes; a first change process of changing the frequency characteristic of the first audio signal that was distributed to the first output process based on the first data that was set according to the low-frequency-reproduction capability of the first output process when the adjustment value of the volume-adjustment process is greater than a second adjustment value; and a second change process of changing the frequency characteristic of the second audio signal that was distributed to the second output process based on the second data that was set according to the low-frequency-reproduction capability of the second output process, when the adjustment value of the volume-adjustment process is greater than a third adjustment value and the signal level is greater than a first specified value.

According to the present invention, it is possible to independently correct audio signals that are sent to the speakers according to the reproduction capability of each speaker, so even when there is a plurality of speakers such as in a car audio system, it is possible to obtain optimum sound output and optimum sound field.

(21) The above object of the present invention is a data-recording medium that readable by a computer and on which a sound-correction program that makes a computer operate such as to change the characteristics of an input audio signal and output the changed audio signal to first and second output devices wherein the program causes the computer to function as; a detection device which detects the adjustment value of a volume-adjustment device that adjusts the volume of the audio signal and detects the signal level of a specified frequency bandwidth of the audio signal; a distribution device which divides and distributes the audio signal to the first and second output devices; a change device which changes the frequency characteristic of the first audio signal that was distributed to the first output device based on the first data that was set according to the low-frequency-reproduction capability of the first output device, as well as changes the frequency characteristic of the second audio signal that was distributed to the second output device based on the second data that was set according to the low-frequency-reproduction capability of the second output device, when the adjustment value of the volume-adjustment device is greater than the first adjustment value and the signal level is greater than a first specified value.

According to the present invention, it is possible to independently correct audio signals that are sent to the speakers according to the reproduction capability of each speaker, so even when there is a plurality of speakers such as in a car audio system, it is possible to obtain optimum sound output and optimum sound field.

(22) The above object of the present invention is a data-recording medium that readable by a computer and on which a sound-correction program that makes a computer operate such as to change the characteristics of an input audio signal and output the changed audio signal to first and second output devices wherein the program causes the computer to function as; a detection device which detects the adjustment value of a volume-adjustment device that adjusts the volume of the audio signal and detects the signal level of a low-frequency bandwidth that is less than a first specified frequency of the audio signal; a distribution device which divides and distributes the audio signal to the first and second output devices; a low-frequency-removal device which removes the low-frequency characteristic of the first audio signal that was distributed to the first output device based on the first data that was set according to the low-frequency-reproduction capability of the first output device when the adjustment value of the volume-adjustment device is greater than a second adjustment value; and removes the low-frequency characteristic of the second audio signal that was distributed to the second output device based on the second data that was set according to the low-frequency-reproduction capability of said second output device, when the adjustment value of said volume-adjustment device is greater than a third adjustment value and said signal level is greater than said first specified value.

According to the present invention, it is possible to independently correct audio signals that are sent to the speakers according to the reproduction capability of each speaker, so even when there is a plurality of speakers such as in a car audio system, it is possible to obtain optimum sound output and optimum sound field.

DESRIPTION OF THE PREFERRED EMBODIMENTS

The preferred embodiments of the invention will be explained with reference to the drawings.

First Embodiment

Figure 1:
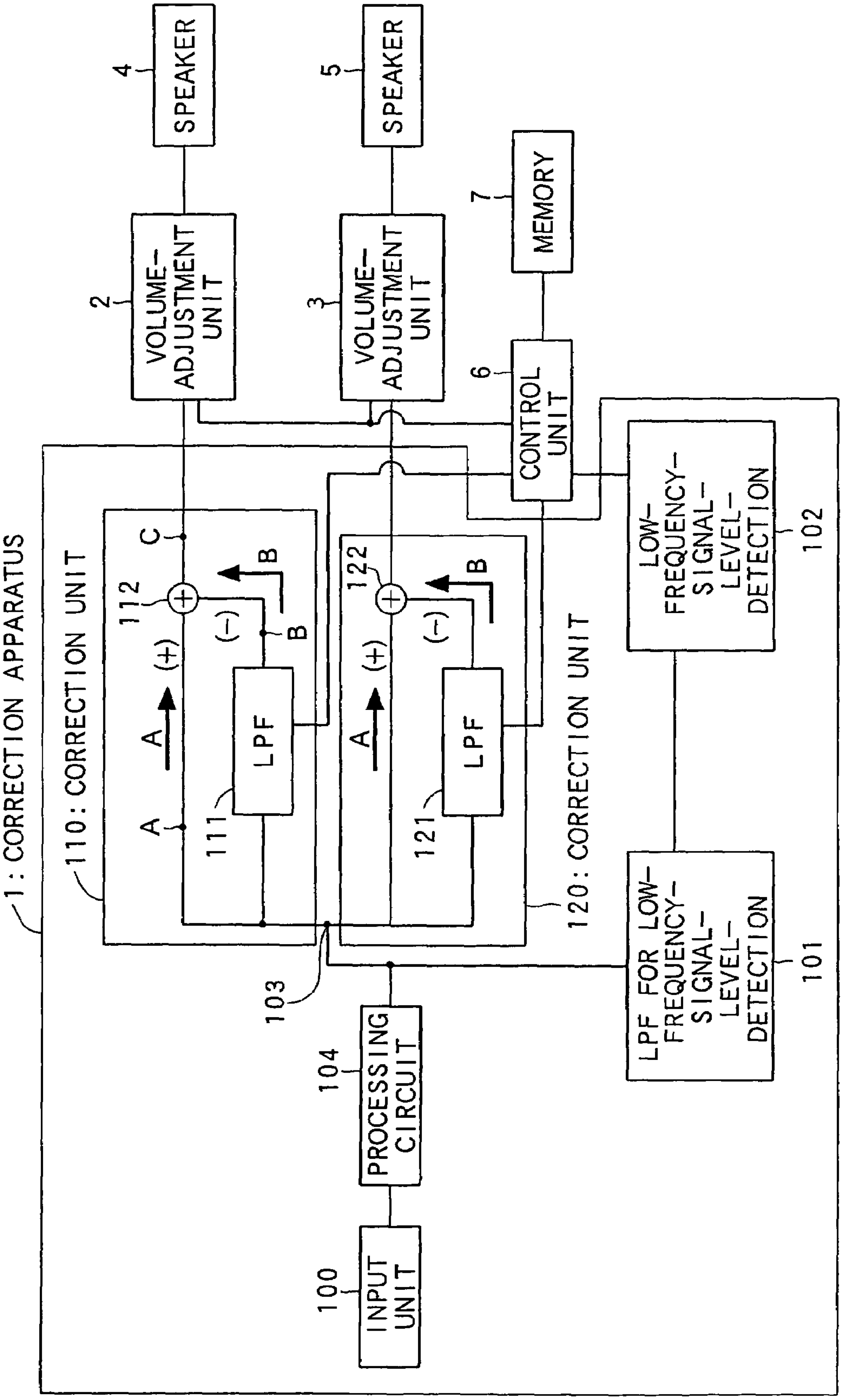
FIG. 1 is a block diagram of a sound-correction system.

FIG. 1 is a block diagram of the sound-correction system for explaining the sound-correction apparatus. In order to simplify the explanation, FIG. 1 shows only one channel.

The sound-correction system comprises: a correction apparatus 1; volume-adjustment units 2 and 3 as an example of a volume-adjustment device for adjusting the volume of the audio signal; speakers 4 and 5 as examples of first and second output devices; a control unit 6 as an example of a first detection device and a control device; and a memory 7 as an example of a memory device.

The correction apparatus 1 comprises a DSPIC (Digital Signal Processing Integrated Circuits), for example, and changes the characteristics of the input audio signal, then outputs the changed audio signal to the first and second output devices. Also, the correction apparatus 1 comprises: an input unit 100 to which the audio signal is input; an LPF (Low Pass Filter) for low-frequency-signal-level-detection 101; an low-frequency-signal-level-detection 102 as an example of a second detection device; a branching point 103 as an example of a division device; and correction units 110 and 120 as examples of first and second change device or first and second low-frequency-removal device.

The input unit 100 outputs the input audio signal to the LPF for low-frequency-signal-level-detection 101 and the processing circuit 104.

The processing circuit 104 is a circuit that performs normal processing, such as roundness and tone processing, on the audio signal input from the input unit 100.

The input audio signal for which normal processing, such as roundness and tone processing, has been performed by the processing circuit 104 is input to the branching point 103, and it divides that input audio signal and distributes it to the correction units 110, 120 located in each of the speakers 4, 5.

The correction units 110, 120 correct the distributed audio signals according to instructions from the control unit 6 based on first and second data stored in memory for each speaker, and output the results to the sound-adjustment units 2, 3. The correction units 110, 120 respectively comprise: LPFs 111, 121 and operation circuits 112, 122; and the speakers 4, 5 comprise low-cut filters according to their respective reproduction capability. Also, the first and second data are the low-frequency removal characteristics, for example, that are set for each speaker according to the low-frequency reproduction capability of the speakers, and in the case where the correction unit has a low-pass filter, the data indicates the cutoff frequency of that low-pass filter. When the correction unit uses a low-pass filter and operation circuit to form a low-cut filter in this way, signal processing is only performed on the part of the audio signal which is to be corrected, or in other words the part that is in the low-frequency range, and the part of the audio signal in the middle- and high-frequency range that is not to be corrected is not processed but output directly, so it is possible to prevent noise from occurring in the middle and high-frequency range of the audio signal due to correction processing.

Of the signal for which the processing circuit 104 performed normal processing, such as roundness and tone processing, the LPF for low-frequency-signal-level-detection 101 extracts the signal level in the low-frequency range below a specified frequency, for example below 200 Hz, and sends it to the low-frequency-signal-level-detection 102.

The LPF for low-frequency-signal-level-detection 101 detects the low-frequency signal level that was sent, and determines whether or not the signal level is greater than a pre-determined level (first specified value), and outputs the judgment result to the control unit 6. The reason for detecting the signal level in the low-frequency range of the normally processed input audio signal is that when the signal level in the low-frequency range is a minimum, the low-frequency reproduction capability of the speaker to be described later does not become a problem, and so it is not necessary to perform correction.

The volume-adjustment units 2, 3 are located in each output device. Also, the volume-adjustment units 2, 3 are connected and operate together, and they adjust the volume of the respective audio signal according to adjustment values set by the user, and output the signals to the speakers 4, 5.

The speakers 4, 5 respectively output the audio signals that have been adjusted by the volume-adjustment units 2, 3.

The memory 7 stores the adjustment values from the volume-adjustment units 2,3, which are the reference values for operation of the correction units 110, 120, as first adjustment values, and stores the signal levels of a specified low-frequency range of the input audio signal, which are reference values for operation of the correction units 110, 120, as first specified data, and furthermore, stores first and second data (first and second low-frequency-removal characteristics) for operation of the correction units 110, 120 and relates it to each respective speaker. In other words, the memory 7 stores the necessary data for correcting the audio signal by the LPFs 111, 121 of the correction units 110, 120.

The control unit 6 controls the operation of all these units. Also, based on the signal levels detected by the low-frequency-signal-level-detection 102, the adjustment values of the volume-adjustment units 2, 3 and the first adjustment value and first specified value, or the first and second data stored in the memory, the control unit 6 particularly controls whether or not to operate the correction units 110, 120 and what kind of operation to perform.

As an example of control by the control unit 6, it detects whether or not the adjustment values of the volume-adjustment units 2, 3 are larger than the first adjustment value, and when the values are less than the first adjustment value, it does not operate the correction units 110, 120, however when the values are greater than the first adjustment value, it operates the correction units 110, 120. As another example, the detection result of whether or not the signal level of a specified frequency range of the audio signal detected by the low-frequency-signal-level-detection 102 is larger than the first specified value is input to the control unit 6, and when it is less than the first specified value, the control unit 6 does not operate the correction units 110, 120, however, when it is greater than the first specified value, it operates the correction units 110, 120. Also, the detection result of whether or not the signal level of a specified frequency range of the audio signal detected by the low-frequency-signal-level-detection 102 is greater than the first specified value is input to the control unit 6, and it detects whether or not the adjustment values of the volume-adjustment units 2, 3 are greater than the first adjustment value, and when either detection result is less than the first adjustment value 1 or first specified value, the control unit 6 does not operate the correction units 110, 120, however, when both detection results are greater than the first adjustment value and first specified value, then the control unit 6 operates the correction units 110, 120.

The processing circuit 104 mentioned above is located between the input unit 100 and the branching point 103; however, it is also possible not to have a processing circuit 104.

The input audio signal is input from the input unit 100 to the processing circuit 104 that performs normal processing such as roundness or tone processing. The input audio signal is then output to the LPF for low-frequency-signal-level-detection 101 and the branching point 103.

At the branching point 103, the input audio signal is divided and distributed to the correction units 110, 120 of the speakers 4, 5.

The frequency characteristics of the divided and distributed audio signals are corrected by the respective correction units 110, 120, according to an instruction from the control unit 6 and based on the first and second data (first and second low-frequency-removal characteristics) stored in memory for each speaker, and then output from the correction apparatus 1.

The volume levels of the audio signals output from the correction apparatus 1 are adjusted by the volume-adjustment units 2, 3 according to adjustment values set by the user, and then output to the speakers 4, 5.

Figure 2:
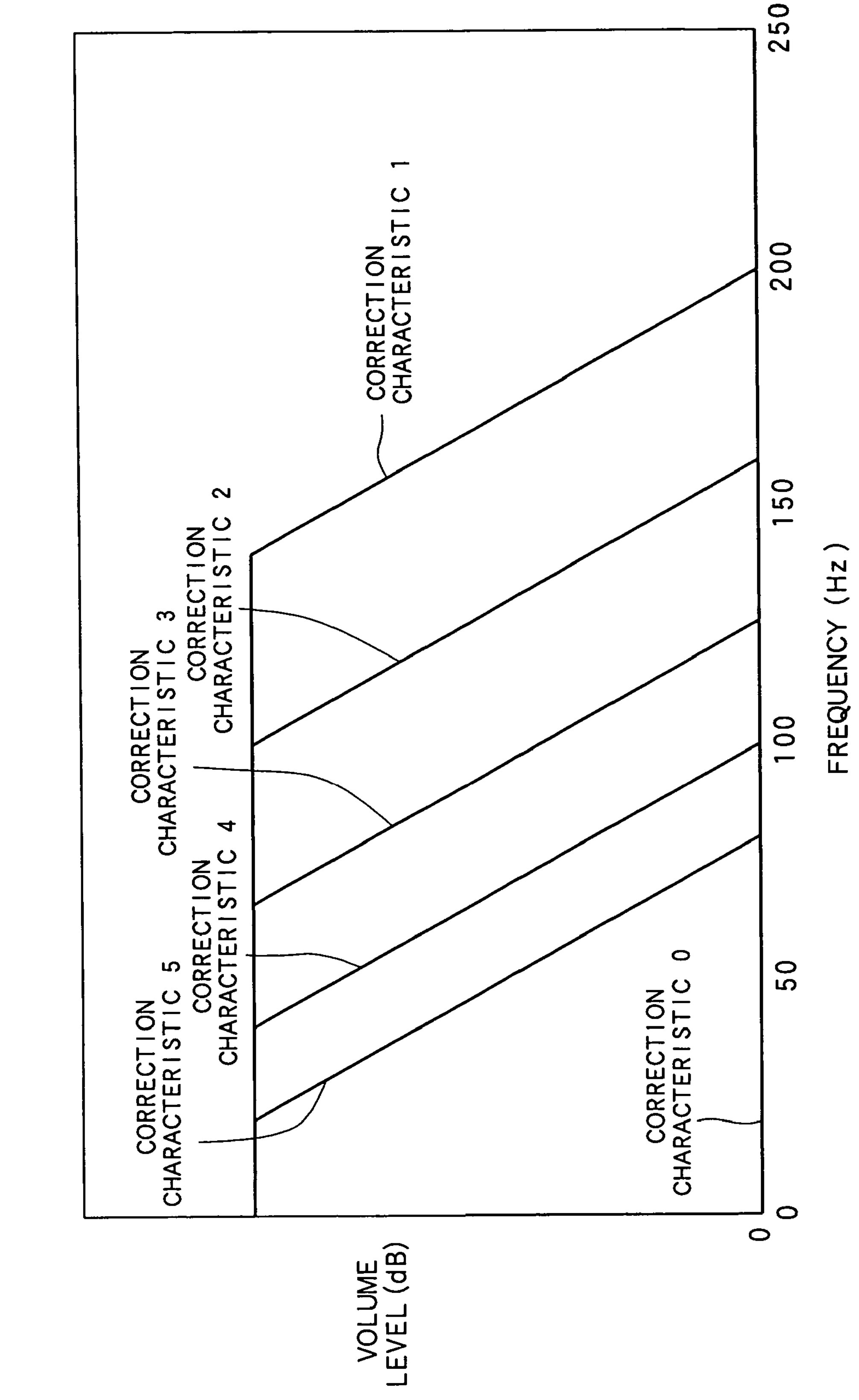
FIG. 2 is a drawing explaining the LPF correction characteristics.

FIG. 2 is a graph showing an example of frequency characteristics (correction characteristics) that are set for the LPFs 111, 121.

In this example, the interval between each correction characteristic is ⅓ of an octave. Correction characteristic 1 is the characteristic in which the cutoff frequency is 200 Hz, correction characteristic 2 is the characteristic in which the cutoff frequency is 160 Hz, correction characteristic 3 is the characteristic in which the cutoff frequency is 125 Hz, correction characteristic 4 is the characteristic in which the cutoff frequency is 100 Hz, correction characteristic 5 is the characteristic in which the cutoff frequency is 80 Hz, correction characteristic 0 does not perform correction and the characteristic is flat and the level is $-\infty$. However, the intervals between the frequency characteristics and definite frequencies are not limited to those described above, and can be appropriately set. The frequency characteristics set for the LPFs 111, 121 are determined by the low-frequency-reproduction-capability-judgment process and correction-characteristics-setting process described later, based on the low-frequency reproduction capabilities of the speakers.

One cutoff frequency fc is set for each speaker by the low-frequency-reproduction-capability-judgment process based on the low-frequency-reproduction capability of the speaker, and a correction characteristic is set from among correction characteristics 1 to 5 or correction characteristic 0 according to that set cutoff frequency fc. The set correction characteristics are respectively set for the LPFs 111, 121. Each of the cutoff frequencies corresponds to the respective speaker and is stored in the memory 7.

Figure 3A:
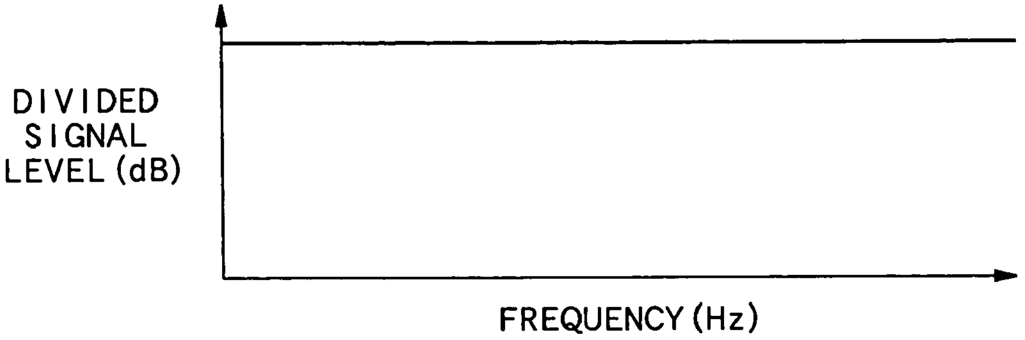
FIGS. 3A to 3C are graphs of normalized signal levels at each location in the sound-correction apparatus.
Figure 3B:
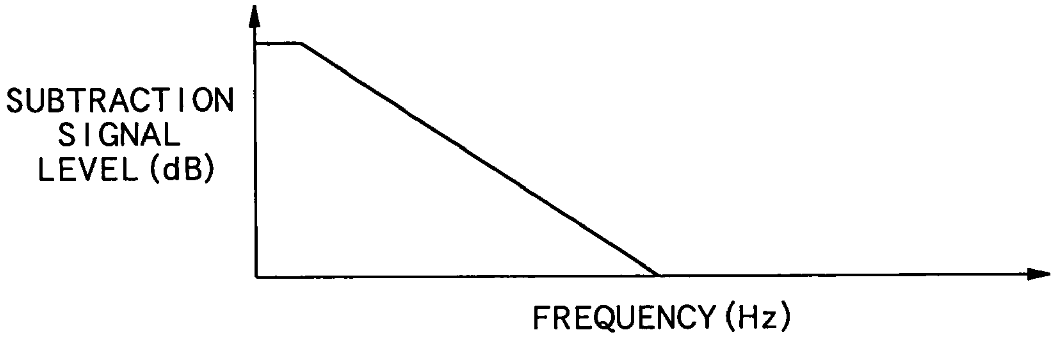
Figure 3C:
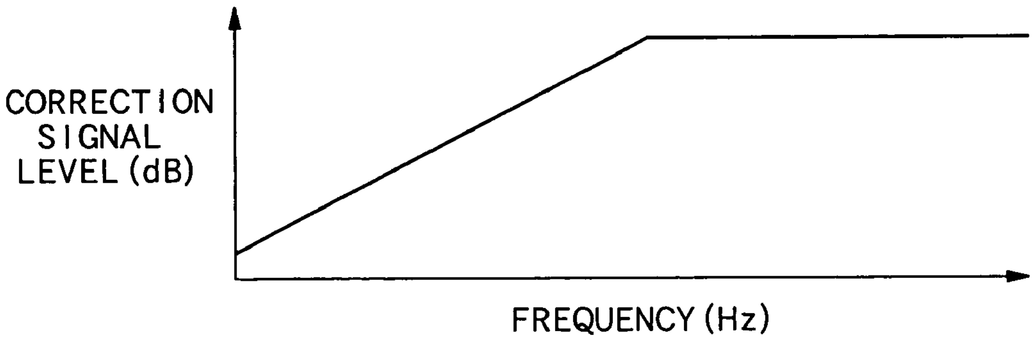

FIG. 3A to FIG. 3C are graphs showing normalized signal levels at each location in the sound-correction apparatus.

FIG. 3A is a normalized graph of the divided signal level of the divided audio signal that was divided by the branching point 3 for which normal processing is performed at the location point A in FIG. 1. FIG. 3B is a normalized graph of the subtraction signal level of the low-frequency range extracted by the LPF 111 from the divided audio signal at location point B in FIG. 1. FIG. 3C is a normalized graph of the correction signal level of the audio signal that was operated on and whose characteristics were corrected by the operation circuit 112 at the location point C in FIG. 1. The normalized graph of FIG. 3C shows the signal level after the signal level extracted by the LPF 111 (see FIG. 3B) has been subtracted from the signal level for which only normal processing was performed (see FIG. 3A). The correction characteristic for the LPF 121 is set in a similar way.

Figure 4:
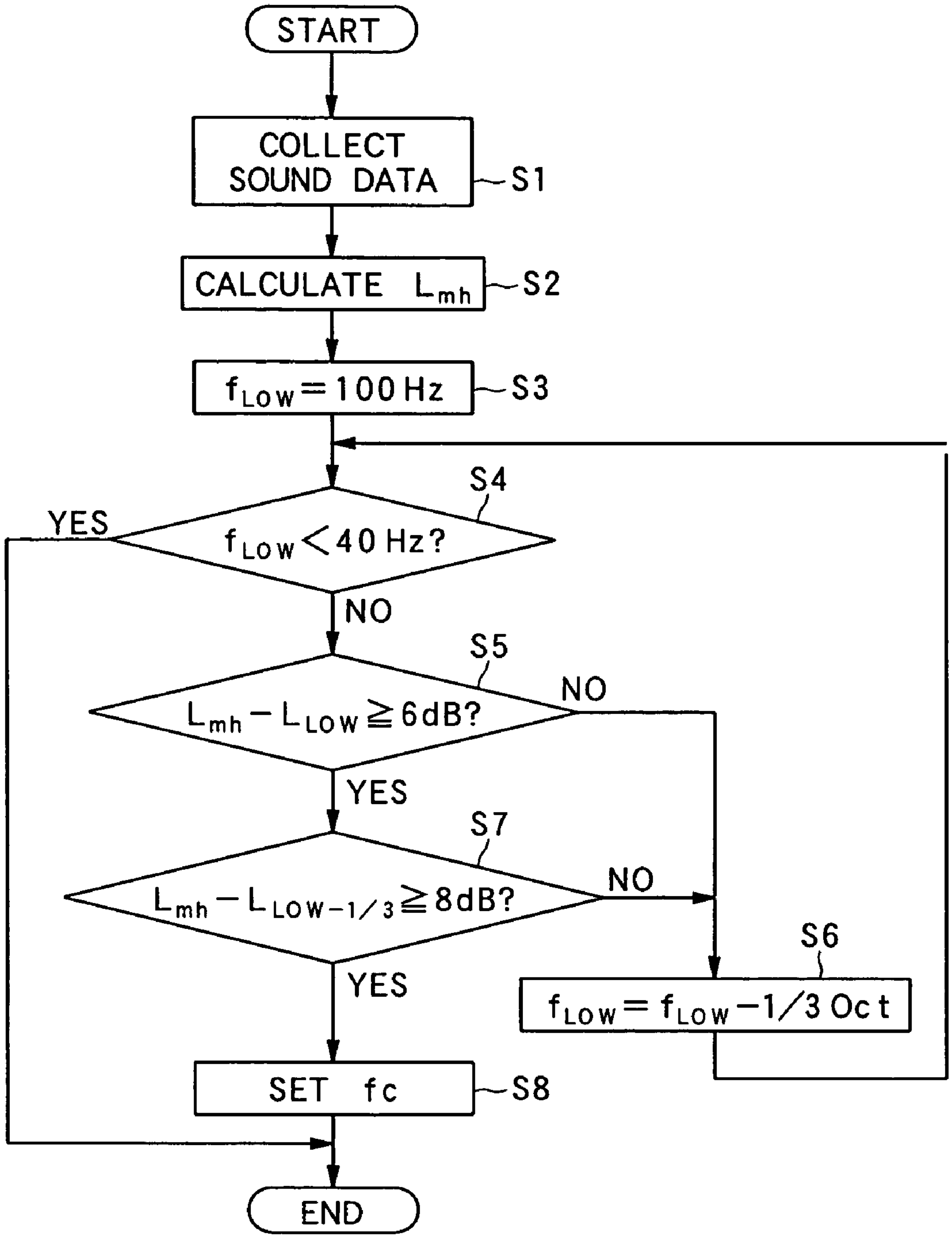
FIG. 4 is a flowchart of the low-frequency reproduction capability judgment process.

Next, the low-frequency-reproduction-capability-judgment process will be explained using the flowchart shown in FIG. 4. This is a flowchart of the process executed under control of the control unit 6 based on a program recorded in the memory 7. The procedure of determining the low-frequency-reproduction capability of speaker 4 and then setting the cutoff frequency fc of LPF 111 will be explained.

First, of the plurality of speakers, pink noise is input to one speaker 4, and the sound output from speaker 4 is collected using a microphone (not shown in the figure) as sound data (step S1).

Next, of the collected sound data, the average level of the signal in the middle and high-frequency ranges (for example, above 200 Hz) is calculated as the average-middle/high-frequency-signal level $L_{mh}$ (step S2).

Next, the first comparison-low-frequency range $f_{low}$ is set to 100 Hz (step S3). The average level of the frequency range having a width of ⅓ octave that is centered around the frequency 100 Hz is compared with the calculated average-middle/high-frequency-signal level $L_{mh}$, and the low-frequency-reproduction capability is judged.

This comparison-low-frequency range $f_{low}$ is gradually reduced from 100 Hz to 80 Hz, 63 Hz, 50 Hz and 40 Hz for each ⅓ octave in an operation to be explained later, and the low-frequency-reproduction capability is judged.

Also, it is determined whether or not the current comparison-low-frequency range $f_{low}$ is less than the final comparison-low-frequency range, which is 40 Hz (step S4). When the current comparison-low-frequency range $f_{low}$ is greater than the final comparison-low-frequency range of 40 Hz (step S4: NO), the level $L_{low}$ of the comparison-low-frequency range $f_{low}$ is compared with the average-middle/high-frequency-signal level $L_{mh}$ that was calculated in step S2 to determine wither or not the average-middle/high-frequency-signal level $L_{mh}$ is greater than the level $L_{low}$ of the comparison-low-frequency range $f_{low}$ by 6 dB or more (step S5).

On the other hand, when the result of the judgment in step S4 is that the comparison-low-frequency range $f_{low}$ is less than the final comparison-low-frequency range of 40 Hz (step S4: YES), it can be determined that the speaker 4 is capable of proper reproduction up to a low-frequency-reproduction capability of 40 Hz or less, so the cutoff frequency fc cannot be set. In other words, in the correction-characteristics-setting process to be described later, the correction characteristic 0 shown in FIG. 2 is set for LPF 111, and the signal at LPF 111 and indicated by arrow B in FIG. 1 does not exist, and only the sound signal indicated by arrow A for which normal processing was performed passes through the volume-adjustment unit 2 and is output as sound from the speaker 4. At this time, the cutoff frequency fc is stored in the memory 7 as not being set.

When the result of the judgment in step S5 is that the average-middle/high-frequency-signal level $L_{mh}$ is not greater than the level $L_{low}$ of the comparison-low-frequency-range $f_{low}$ by 6 dB or more, (step S5: NO), then the speaker 4 is capable of proper reproduction up to the low-frequency-reproduction capability of this comparison-low-frequency-range $f_{low}$, so the comparison-low-frequency-range $f_{low}$ is reduced another ⅓ octave and the process returns to step S4 and the reproduction-capability judgment is performed again for the next comparison-low-frequency-range $f_{low}$ (step S6).

On the other hand, when the average-middle/high-frequency-signal level $L_{mh}$ is greater than the level $L_{low}$ of the comparison-low-frequency-range $f_{low}$ by 6 dB or more (step S5: YES), then the level $L_{low\text{-}1/3}$ of the frequency range $f_{low\text{-}1/3}$ ⅓ octave below the comparison-low-frequency-range $f_{low}$ is compared with the average-middle/high-frequency-signal level $L_{mh}$ to determine whether or not the average-middle/high-frequency-signal level $L_{mh}$ is greater than the level $L_{low\text{-}1/3}$ of the frequency range $f_{low\text{-}1/3}$ ⅓ octave below the comparison-low-frequency range $f_{low}$ by 8 dB or more (step S7).

The frequency range $f_{low\text{-}1/3}$ ⅓ octave below the comparison-low-frequency range $f_{low}$ is 80 Hz when the comparison-low-frequency range $f_{low}$ is 100 Hz, so here, the average level $L_{low\text{-}1/3}$ of a frequency range having a width of ⅓ octave centered around the frequency 80 Hz, for example, is compared with the average-middle/high-frequency-signal level $L_{mh}$.

Moreover, when the result of the judgment is that the average-middle/high-frequency-signal level $L_{mh}$ is greater than the level $L_{low\text{-}1/3}$ of the frequency range $f_{low\text{-}1/3}$ ⅓ octave below the comparison-low-frequency range $f_{low}$ by 8 dB or more (step S7: YES), the frequency one octave above that comparison-low-frequency range $f_{low}$ is set as the cutoff frequency fc set for LPF 111 and stored in the memory 7 (step S8), and processing ends. For example, when the comparison-low-frequency range $f_{low}$ is 100 Hz, the frequency one octave above, which is 200 Hz, becomes the cutoff frequency fc.

However, when the average-middle/high-frequency-signal level $L_{mh}$ is not greater than the level $L_{low\text{-}1/3}$ of the frequency range $f_{low\text{-}1/3}$ ⅓ octave below the comparison-low-frequency range $f_{low}$ by 8 dB or more (step S7: NO), then the speaker 4 still has low-frequency-reproduction capability, so the comparison-low-frequency range $f_{low}$ is further reduced ⅓ octave and the process returns to step S4, and the reproduction-capability judgment is performed again for the next comparison-low-frequency-range $f_{low}$ (step S6).

The comparison-low-frequency-range $f_{low}$ is gradually reduced in this way from the 100 Hz set in step S3 ⅓ octave at a time to 80 Hz, 63 Hz, 50 Hz and 40 Hz, and the low-frequency-reproduction capability is judged, and the cutoff frequency fc is set to 200 Hz, 160 Hz, 125 Hz, 100 Hz or 8 Hz, and that value, or the cutoff frequency fc for when reproduction at low frequency is sufficient, is stored in the memory 7.

The correction characteristic is set for LPF 111 based on the cutoff frequency fc of LPF 111, which is data necessary for correction and that is obtained by the operation explained above.

In step S3, the first comparison-low-frequency range $f_{low}$ is taken to be 100 Hz and when there is low-frequency-reproduction capability, the comparison-low-frequency range $f_{low}$ is gradually reduced ⅓ octave at a time, however, the first comparison-low-frequency range $f_{low}$ is not limited to be 100 Hz, and when there is low-frequency-reproduction capability, the final first comparison-low-frequency range $f_{low}$ is not limited to being 40 Hz, and the reduction width of the first comparison-low-frequency range $f_{low}$ is not limited to being ⅓ octave each time, and can be set as appropriate.

Also, in step S7, the average-middle/high-frequency-signal level $L_{mh}$ is compared with the level $L_{low\text{-}1/3}$ of the frequency range $f_{low\text{-}1/3}$ that is ⅓ octave further below the first comparison-low-frequency range $f_{low}$, however, it is not limited to this, and it is possible to compare the average-middle/high-frequency-signal level $L_{mh}$ with the level $L_{low\text{-}1/4}$ of the frequency range $f_{low\text{-}1/4}$ that is ¼ octave further below the first comparison-low-frequency range $f_{low}$, or with the level $L_{low\text{-}1/2}$ of the frequency range $f_{low\text{-}1/2}$ that is ½ octave further below the first comparison-low-frequency range $f_{low}$.

Moreover, the threshold value for the judgment in step S7, and the threshold value for the judgment in step S5 were level differences of 6 dB and 8 dB, however they are not limited to these.

Also, in step S8, the frequency one octave above the comparison-low-frequency range $f_{low}$ is taken to be the cutoff frequency fc, however, it is not limited to being one octave.

The cutoff frequency fc for LPF 121 is set by the same procedure according to the low-frequency-reproduction capability of speaker 5, and stored in the memory 7.

Figure 5:
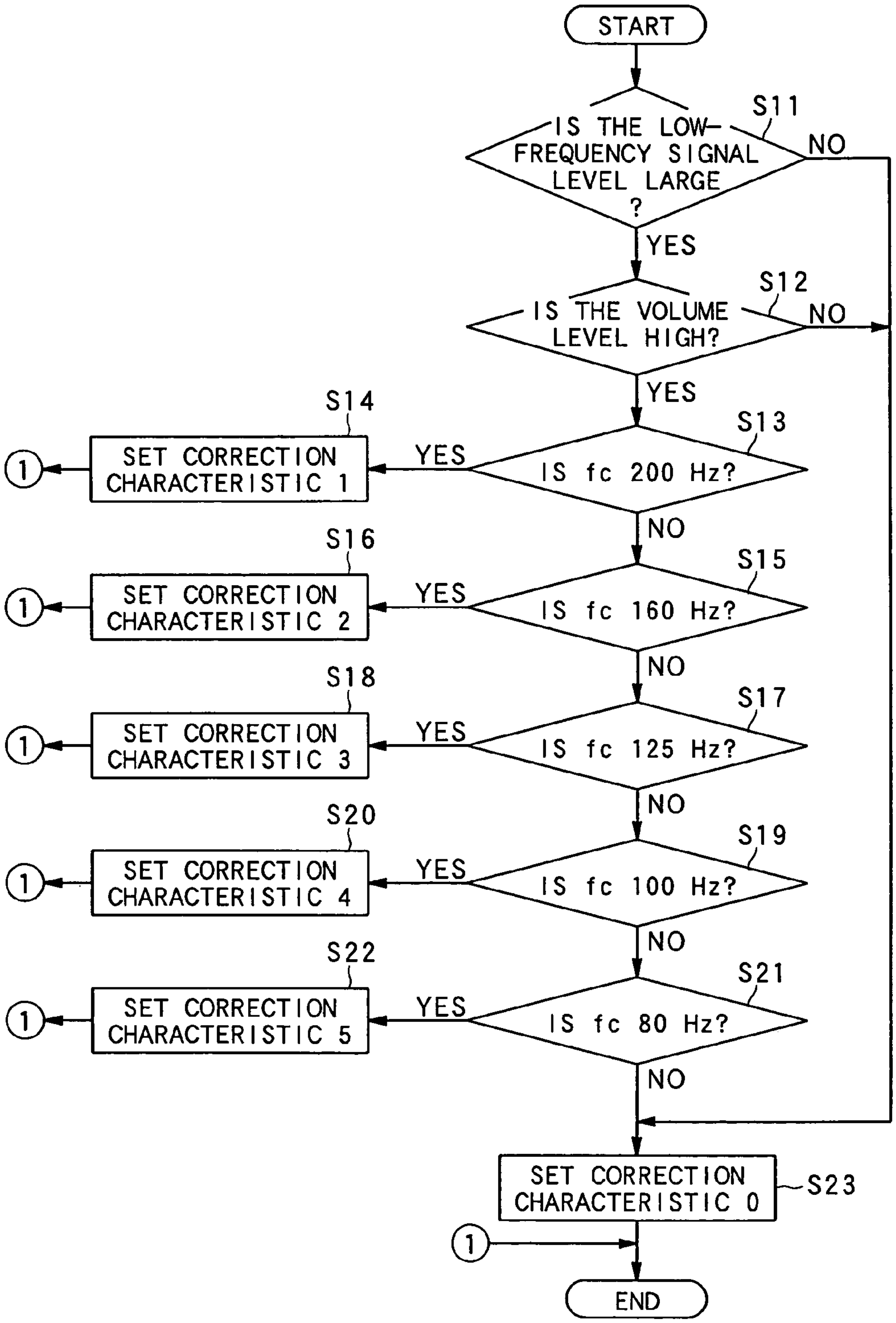
FIG. 5 is a flowchart of the correction-characteristics-setting process of a first embodiment of the invention.

Next, the process of setting the correction characteristic for the LPF will be explained based on the flowchart for the correction-characteristic-setting process shown in FIG. 5. This is a flowchart of the process executed under control of the control unit 6 based on a program recorded in the memory 7.

First, the low-frequency-signal-level-detection 102 determines whether or not the low-frequency signal level of the input audio signal is greater than the preset first specified value, which is the threshold value (for example, a range from the maximum value of the range that can be processed by the correction apparatus 1 comprising a DSPIC up to −12 dB) (step S11).

When the judgment result is that the low-frequency signal level is greater than the first specified value (step S11: YES), it is determined whether or not the adjustment value of the volume-adjustment unit that adjusts the volume level currently being output is greater than the preset first adjustment value, which is the threshold value (for example, a range from the maximum value for the volume up to −20 dB) (step S12). On the other hand, when the low-frequency signal level is less than the first specified value (step S11: NO), correction characteristic 0 is set for LPF 111, and the operation ends. Setting correction characteristic 0 for the LPF device that correction will not be performed. When the low-frequency signal level is low, the low-frequency reproduction capability is not a problem, so it is not necessary to perform correction.

In the judgment of step S12, when the adjustment value of the volume-adjustment unit that adjusts the volume level is less than the first adjustment value (step S12: NO), correction characteristic 0 shown in FIG. 2 is set for LPF 111 and the operation ends (step S23). However, when the adjustment value of the volume-adjustment unit that adjusts the volume level is greater than the first adjustment value (step S12: YES), it is determined whether or not the cutoff frequency fc that is set by the low-frequency-reproduction-capability-judgment process based on the data stored in the memory 7 is 200 Hz (step S13).

When the judgment result is that the cutoff frequency fc is 200 Hz (step S13: YES), correction characteristic 1 shown in FIG. 2 is set for LPF 111 and operation ends (step S14), however, when the cutoff frequency fc is not 200 Hz (step S13: NO), it is determined whether or not the cutoff frequency fc that is set by the low-frequency-reproduction-capability-judgment process based on the data stored in the memory 7 is 160 Hz (step S15).

When the judgment result is that the cutoff frequency fc is 160 Hz (step S15: YES), correction characteristic 2 shown in FIG. 2 is set for LPF 111 and operation ends (step S16), however, when the cutoff frequency fc is not 160 Hz (step S15: NO), it is determined whether or not the cutoff frequency fc that is set by the low-frequency-reproduction-capability-judgment process based on the data stored in the memory 7 is 125 Hz (step S17).

When the judgment result is that the cutoff frequency fc is 125 Hz (step S17: YES), correction characteristic 3 shown in FIG. 2 is set for LPF 111 and operation ends (step S18), however, when the cutoff frequency fc is not 125 Hz (step S17: NO), it is determined whether or not the cutoff frequency fc that is set by the low-frequency-reproduction-capability-judgment process based on the data stored in the memory 7 is 100 Hz (step S19).

When the judgment result is that the cutoff frequency fc is 100 Hz (step S19: YES), correction characteristic 4 shown in FIG. 2 is set for LPF 111 and operation ends (step S20), however, when the cutoff frequency fc is not 100 Hz (step S19: NO), it is determined whether or not the cutoff frequency fc that is set by the low-frequency-reproduction-capability-judgment process based on the data stored in the memory 7 is 80 Hz (step S21).

When the judgment result is that the cutoff frequency fc is 80 Hz (step S21: YES), correction characteristic 5 shown in FIG. 2 is set for LPF 111 and operation ends (step S22), however, when the cutoff frequency fc is not 80 Hz, or in other words, when there is sufficient low-frequency-reproduction capability, the fact that the cutoff frequency fc is not set is stored in the memory 7(step S21: NO), then correction characteristic 0 shown in FIG. 2 is set for LPF 111 and operation ends (step S23). That is, since the signal indicated by arrow B in FIG. 1 does not exist, only the signal indicated by arrow A for which normal processing is performed passes through the volume-adjustment unit 2 and is output.

The operation explained above is constantly performed repeatedly at a specified interval since the audio signal constantly changes even though the volume does not change. However, as a modification, it is possible to perform the operation at specified timing such as when a song changes, when selecting a station, when switching the source, or when changing the volume.

The operation explained above is completely performed based on control from the control unit 6. The correction characteristic for LPF 121 is set by a similar procedure.

In the first embodiment explained above, it is possible to correct the audio signals sent to the speakers independently according to the reproduction capability of the speakers, so even in the case of a car audio system having a plurality of speakers, it is effective in making it possible to obtain optimum sound output and an optimum sound field.

Also, it is effective in making it possible to obtain optimum sound output and optimum sound field according to the reproduction capability for each speaker.

Second Embodiment

Except for the operation of the correction-characteristic-setting process, control by the control unit, and data stored in the memory, the second embodiment is the same as the first embodiment, so an explanation of similar construction will be omitted.

The memory 7 stores and first and second data (first and second low-frequency-removal characteristics) for operating the respective correction units 110, 120, and relates the data to each speaker; and further stores the adjustment value for the volume-adjustment units 2, 3, which is the reference values for operating the correction units 110, 120, as a first adjustment value, and stores adjustment values for volume-adjustment units 2, 3, which are the reference values for operating the correction units 110, 120, as second and third adjustment values and relates them to each speaker; and stores the signal level of a specified low-frequency range of the input audio signal, which is the reference for operating the correction units 110, 120, as a first specified value. In other words, memory 7 stores the data necessary for the LPFs 111, 121 of the correction units 110, 120 to correct the audio signal.

In this embodiment, when the judgment in step S32 is YES and the cutoff frequency fc set by the low-frequency-reproduction-capability judgment for speaker 4 is 160 Hz, and the adjustment value of the volume-adjustment unit 2 is greater than −18 dB, which is the second adjustment value (step S36: YES, correction characteristic 2 is set for LPF 111; and when the cutoff frequency fc is 125 Hz and the adjustment value of the volume-adjustment unit 2 is greater than −16 dB, which is the second adjustment value (step S39: YES), correction characteristic 3 is set for LPF 111; and when the cutoff frequency fc is 100 Hz and the adjustment value of the volume-adjustment unit 2 is greater than −14 dB, which is the second adjustment value (step S42: YES), correction characteristic 4 is set for LPF 111; and when the cutoff frequency fc is 80 Hz and the adjustment value of the volume-adjustment unit 2 is greater than −12 dB, which is the second adjustment value (step S45: YES), correction characteristic 5 is set for LPF 111.

Also, similarly, when the judgment in step S32 is YES and the cutoff frequency fc set by the low-frequency-reproduction-capability judgment for speaker 5 is 160 Hz, and the adjustment value of the volume-adjustment unit 2 is greater than −18 dB, which is the third adjustment value (step S36: YES, correction characteristic 2 is set for LPF 121; and when the cutoff frequency fc is 125 Hz and the adjustment value of the volume-adjustment unit 2 is greater than −16 dB, which is the third adjustment value (step S39: YES), correction characteristic 3 is set for LPF 121; and when the cutoff frequency fc is 100 Hz and the adjustment value of the volume-adjustment unit 2 is greater than −14 dB, which is the third adjustment value (step S42: YES), correction characteristic 4 is set for LPF 121; and when the cutoff frequency fc is 80 Hz and the adjustment value of the volume-adjustment unit 2 is greater than −12 dB, which is the third adjustment value (step S45: YES), correction characteristic 5 is set for LPF 121.

The control unit 6 controls the operation of the entire sound-correction system. Also, the control unit 6, particularly controls whether or not to operate the correction units 110, 120 and what kind of operation to perform based on the signal level detected by the low-frequency-signal-level-detection 102, the adjustment values for the volume-adjustment units 2, 3, the first to third adjustment values, first specified value and first and second data stored in the memory.

As an example of control by the control unit 6, the detection result of whether or not the signal level of a specified frequency range of the audio signal detected by the low-frequency-signal-level-detection 102 is larger than the first specified value is input to the control unit 6, and it detects whether or not the adjustment value of the volume-adjustment unit 2 is larger than the second adjustment value and whether or not the adjustment value of the volume-adjustment unit 3 is larger than the third adjustment value; and when the signal level is less than the first specified value the control unit 6 does not operate the correction units 110, 120; and when the signal level is greater than the first specified value and the adjustment value of the volume-adjustment unit 2 is greater than the second adjustment value, the control unit operates the correction unit 110; and when the signal level is greater than the first specified value and the adjustment value of the volume-adjustment unit 3 is greater than the third adjustment value, the control unit 6 operates the correction unit 120.

The operation of the second embodiment takes into consideration the volume level corresponding to the set correction characteristic when setting a correction characteristic for the LPFs.

Figure 6:
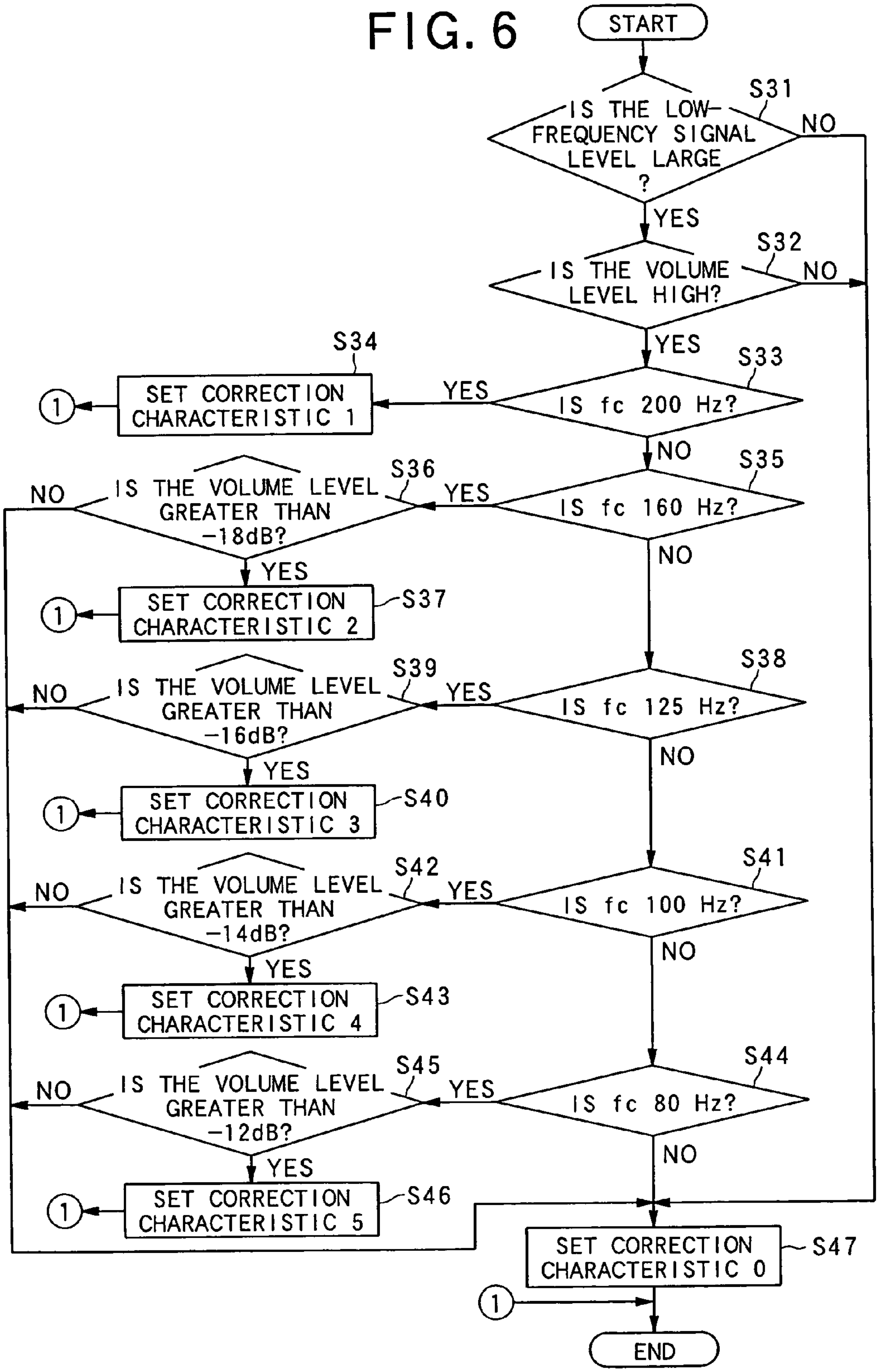
FIG. 6 is a flowchart of the correction-characteristics-setting process of a second embodiment of the invention.

Next, the operation of the correction-characteristic-setting process of this second embodiment will be explained using the flowchart of the correction-characteristic-setting process shown in FIG. 6. This flowchart shows the process that is executed under the control of the control unit 6 based on a program stored in the memory 7.

First, the low-frequency-signal-level-detection 102 determines whether or not the low-frequency signal level of the input audio signal is greater than the first specified value (for example, −12 dB from the DSP full-scale), which is the preset threshold value (step S31).

When the low-frequency signal level is greater than the first specified value (step S31: YES), it is determined whether or not the adjustment value of the volume-adjustment unit 2, which adjusts the volume level that is currently being output, is greater than the first adjustment value (for example, −20 dB as the volume value), which is the preset threshold value (step S32).

On the other hand, when the low-frequency signal level is less than the first specified value (step S31: NO), correction characteristic 0 shown in FIG. 2 is set for LPF 111 and operation ends. Setting correction characteristic 0 for the LPF device that correction will not be performed. When the low-frequency signal level is small, the low-frequency reproduction capability does not become a problem, so it is not necessary to perform correction.

In the judgment of step S32, when the adjustment value of volume-adjustment unit 2 that adjusts the volume level is less than the first adjustment value (step S32: NO), correction characteristic 0 is set for LPF 111 and operation ends. Setting correction characteristic 0 for the LPF device that correction will not be performed.

When the volume level is small, the low-frequency reproduction capability does not become a problem, so it is not necessary to perform correction.

On the other hand, when the adjustment value of volume-adjustment unit 2 that adjusts the volume level is greater than the first adjustment value (step S32: YES), it is determined whether or not the cutoff frequency fc set by the low-frequency-reproduction-capability-judgment process based on the data stored in the memory 7 is 200 Hz (step S33).

When the judgment result is that the cutoff frequency fc is 200 Hz (step S33: YES), correction characteristic 1 is set for LPF 111 and operation ends (step S34), however, when the cutoff frequency fc is not 200 Hz (step S33: NO), it is determined whether or not the cutoff frequency fc set by the low-frequency-reproduction-capability-judgment process based on the data stored in the memory 7 is 160 Hz (step S35).

When the judgment result is that the cutoff frequency fc is 160 Hz (step S35: YES), it is determined whether or not the adjustment value of the volume-adjustment unit 2 that adjusts the volume level is greater than −18 dB, which is the second adjustment value (step S36), and when the adjustment value of the volume-adjustment unit 2 that adjusts the volume level is greater than −18 dB (step S36: YES), correction characteristic 2 shown in FIG. 2 is set for LPF 111 and operation ends (step S37).

On the other hand, when the adjustment value of the volume-adjustment unit 2 that adjusts the volume level is less than −18 dB (step S36: NO), correction characteristic 0 is set for LPF 111 and operation ends (step S47).

Also, when the cutoff frequency fc is not 160 Hz (step S35: NO), it is determined whether or not the cutoff frequency fc set in the low-frequency-reproduction-judgment process based on the data stored in the memory 7 is 125 Hz (step S38).

When the judgment result is that the cutoff frequency fc is 125 Hz (step S38: YES), it is determined whether or not the adjustment value of the volume-adjustment unit 2 that adjusts the volume level is greater than −16 dB, which is the second adjustment value (step S39), and when the volume level is greater than −16 dB (step S39: YES), correction characteristic 3 shown in FIG. 2 is set for LPF 111 and operation ends (step S40).

On the other hand, when the adjustment value of the volume-adjustment unit 2 that adjusts the volume level is less than −16 dB (step S39: NO), correction characteristic 0 is set for LPF 111 and operation ends (step S47).

Also, when the cutoff frequency fc is not 125 Hz (step S38: NO), it is determined whether or not the cutoff frequency fc set in the low-frequency-reproduction-judgment process based on the data stored in the memory 7 is 100 Hz (step S41).

When the judgment result is that the cutoff frequency fc is 100 Hz (step S41: YES), it is determined whether or not the adjustment value of the volume-adjustment unit 2 that adjusts the volume level is greater than −14 dB, which is the second adjustment value (step S42), and when the volume level is greater than −14 dB (step S42: YES), correction characteristic 4 shown in FIG. 2 is set for LPF 111 and operation ends (step S43).

On the other hand, when the adjustment value of the volume-adjustment unit 2 that adjusts the volume level is less than −14 dB (step S42: NO), correction characteristic 0 is set for LPF 111 and operation ends (step S47).

Also, when the cutoff frequency fc is not 100 Hz (step S41: NO), it is determined whether or not the cutoff frequency fc set in the low-frequency-reproduction-judgment process based on the data stored in the memory 7 is 80 Hz (step S44).

When the judgment result is that the cutoff frequency fc is 80 Hz (step S44: YES), it is determined whether or not the adjustment value of the volume-adjustment unit 2 that adjusts the volume level is greater than −12 dB, which is the second adjustment value (step S45), and when the volume level is greater than −12 dB (step S45: YES), correction characteristic 5 shown in FIG. 2 is set for LPF 111 and operation ends (step S46).

On the other hand, when the adjustment value of the volume-adjustment unit 2 that adjusts the volume level is less than −12 dB (step S45: NO), correction characteristic 0 is set for LPF 111 and operation ends (step S47).

However, when the cutoff frequency fc is not 80 Hz, or in other words, when there is sufficient low-frequency reproduction capability and the fact that the cutoff frequency fc is not set is stored in the memory 7 (step S44: NO), correction characteristic 0 is set for LPF 111 and operation ends (step S47). That is, since the signal indicated by arrow B in FIG. 1 does not exist, only the signal indicated by arrow A for which normal processing is performed passes through the volume-adjustment unit 2 and is output.

The operation explained above is constantly performed repeatedly at a specified interval since the audio signal constantly changes even though the volume does not change. However, as a modification, it is possible to perform the operation at specified timing such as when a song changes, when selecting a station, when switching the source, or when changing the volume.

The operation explained above is completely performed based on control from the control unit 6. The correction characteristic for LPF 121 is set by a similar procedure.

In the second embodiment explained above, it is possible to correct the audio signals sent to the speakers independently according to the reproduction capability of the speakers, so even in the case of a car audio system having a plurality of speakers, it is effective in making it possible to obtain optimum sound output and an optimum sound field.

Also, it is effective in making it possible to obtain optimum sound output and optimum sound field without affecting the reproduction capability of the speakers.

Furthermore, since the audio signal sent to a speaker is corrected only when the sound level from the speaker is greater than a level that is preset according to the low-frequency-reproduction capability of that speaker, the correction process is only performed when the correction effect is expected, and thus it is effective in making it possible to obtain even more optimum sound output.

The operation of the sound-correction apparatus described above can also be programmed and executed by a computer.

The entire disclosure of Japanese Patent Application No. 2002-378209 filed on Dec. 26, 2002 including the specification, claims, drawings and summary is incorporated herein by reference in its entirety.

What is claimed is:

1. A sound apparatus having a speaker that receives audio signals and outputs sound, comprising:

a correction device which corrects said audio signals that are input to said speaker; and a correction-characteristic-setting device which sets a correction characteristic of the correction device based on a reproduction capability of said speaker;

wherein said correction device corrects the audio signals based on the set correction characteristic, and wherein said correction-characteristic-setting device sets said correction characteristic when an adjustment value of a volume adjustment device for the audio signals is larger than a first adjustment value and a signal level of a specified frequency bandwidth of the audio signals is larger than a first specified value.

2. The sound apparatus of claim 1 wherein said correction-characteristic-setting device detects the level of the correction-frequency range for which the correction process will be performed for the audio signal input to said speaker, and sets the correction characteristic based on the detected level of the correction-frequency range.

3. The sound apparatus of claim 1 wherein the reproduction capability of said speaker is the low-frequency reproduction capability.

4. The sound apparatus of claim 3 wherein said correction device comprises subtraction circuits that use a low-pass filter having said correction characteristic.

5. The sound apparatus of claim 3 wherein said correction device comprises a high-pass filter having correction characteristic.

6. A sound apparatus that changes the characteristics of an input audio signal and outputs the changed audio signal to first and second output devices, comprising:

a control device that detects an adjustment value of a volume-adjustment device that adjusts the volume of the audio signal;

a distribution device that divides and distributes the audio signal to said first and second output devices;

a memory device that stores first data according to the reproduction capability of said first output device, and stores second data according to the reproduction capability of said second output device;

a first change device that changes the frequency characteristic of the first audio signal that was distributed to said first output device based on said first data;

a second change device that changes the frequency characteristic of the second audio signal that was distributed to said second output device based on said second data; and wherein said control device operates said first and second change devices when the adjustment value of said volume-adjustment device is larger than a first adjustment value and a signal level of a specified frequency bandwidth of the audio signal is larger than a first specified value.

7. The sound apparatus of claim 6 wherein said control device performs control such as not to operate said first and second change devices when the adjustment value of said volume-adjustment device is less than said first adjustment value.

8. A sound apparatus that changes the characteristics of an input audio signal and outputs the changed audio signal to first and second output devices, comprising:

a detection device that detects the signal level of a specified frequency bandwidth of the audio signal;

a distribution device that divides and distributes the audio signal to said first and second output devices;

a memory device that stores first data according to the reproduction capability of said first output device, and stores second data according to the reproduction capability of said second output device;

a first change device that changes the frequency characteristic of the first audio signal that was distributed to said first output device based on said first data;

a second change device that changes the frequency characteristic of the second audio signal that was distributed to said second output device based on said second data; and a control device that detects the adjustment value of a volume-adjustment device that adjusts the volume of the audio signal and operates said first and second change devices when the adjustment value of said volume-adjustment device is greater than a first adjustment value and said signal level is greater than a first specified value.

9. The sound apparatus of claim 8, wherein said control device performs control such as not to operate said first and second change device when the adjustment value of said volume-adjustment device is less than said first adjustment value, or when said signal level is less than said first specified value.

10. The sound apparatus of claim 8, wherein said memory device further stores second and third adjustment values according to both said first and second data; and wherein said control device performs control such that it operates said first change device when said signal level is greater than said first specified value and the adjustment value of said volume-adjustment device is greater than said second adjustment value, and operates said second change device when said signal level is greater than said first specified value and the adjustment value of said volume-adjustment device is greater than said third adjustment value.

11. The sound apparatus of claim 10 wherein said control device performs control such that it does not operate said first and second change devices when said signal level is less than said first specified value.

12. The sound apparatus of claim 10 wherein said second adjustment value is the adjustment value of said volume-adjustment device that is set based on the low-frequency reproduction capability of said first output device, and said third adjustment value is the adjustment value of said volume-adjustment device that is set based on the low-frequency reproduction capability of said second output device.

13. The sound apparatus of claim 8, wherein said specified frequency bandwidth is a low-frequency bandwidth that is less than a first specified frequency, said first data is a first low-frequency-removal characteristic that is set based on the low-frequency-reproduction capability of said first output device, said second data is a second low-frequency removal characteristic that is set based on the low-frequency-reproduction capability of said second output device, said first change device is a first low-frequency-removal device which removes the low frequency based on said first low-frequency-removal characteristic, and said second change device is a second low-frequency-removal device which removes the low frequency based on said second low-frequency-removal characteristic.

14. The sound apparatus of claim 6 wherein said first and second change devices each use a low-pass filter having a frequency characteristic based on said first and second data, respectively.

15. The sound apparatus of claim 6 wherein said memory device detects the low-frequency-reproduction capability of said first output device by collecting the output from said first output device when pink noise is input to said first output device, and stores the first data that was found based on the low-frequency-reproduction capability of said first output device; and detects the low-frequency-reproduction capability of said second output device by collecting the output from said second output device when the pink noise is input to said second output device, and stores the second data that was found based on the low-frequency-reproduction capability of said second output device.

16. A sound-characteristics-change method that changes the characteristics of an input audio signal and outputs the changed audio signal to first and second output devices, comprising the steps of:

detecting the adjustment value of a volume-adjustment device that adjusts the volume of the audio signal;

detecting the signal level of a specified frequency bandwidth of the audio signal;

dividing and distributing the audio signal to said first and second output devices;

changing the frequency characteristic of a first audio signal that was distributed to said first output device based on a first data that was set according to the reproduction capability of said first output device and changing the frequency characteristic of a second audio signal that was distributed to said second output device based on a second data that was set according to the reproduction capability of said second output device, when the adjustment value of said volume-adjustment device is greater than a first adjustment value and said signal level is greater than a first specified value.

17. A sound-characteristics-change method that changes the characteristics of an input audio signal and outputs the changed audio signal to first and second output devices, comprising the steps of:

detecting the adjustment value of a volume-adjustment device that adjusts the volume of the audio signal;

detecting the signal level of a low-frequency bandwidth that is less than a first specified frequency of the audio signal;

dividing and distributing the audio signal to said first and second output devices;

changing the frequency characteristic of a first audio signal that was distributed to said first output device based on a first data that was set according to the reproduction capability of said first output device when the adjustment value of said volume-adjustment device is greater than a second adjustment value and the signal level is greater than a first specified value; and changing the frequency characteristic of a second audio signal that was distributed to said second output device based on a second data that was set according to the reproduction capability of said second output device, when the adjustment value of said volume-adjustment device is greater than a third adjustment value and said signal level is greater than the first specified value.

18. A computer readable medium encoded with a sound-correction program that makes a computer operate such as to change the characteristics of an input audio signal and output the changed audio signal to first and second output devices; wherein the program causes the computer to function as;

a detection device which detects the adjustment value of a volume-adjustment device that adjusts the volume of the audio signal and another detection device that detects the signal level of a specified frequency bandwidth of the audio signal;

a distribution device which divides and distributes the audio signal to said first and second output devices;

a change device which changes the frequency characteristic of a first audio signal that was distributed to said first output device based on a first data that was set according to the reproduction capability of said first output device and changes of the frequency characteristic of a second audio signal that was distributed to said second output device based on a second data that was set according to the reproduction capability of said second output device, when the adjustment value of said volume-adjustment device is greater than a first adjustment value and said signal level is greater than a first specified value.

19. A computer readable medium encoded with a sound-correction program that makes a computer operate such as to change the characteristics of an input audio signal and output the changed audio signal to first and second output devices, wherein the program causes the computer to function as;

a detection device which detects the adjustment value of a volume-adjustment device that adjusts the volume of the audio signal and another detection device that detects the signal level of a low-frequency bandwidth that is less than a first specified frequency of the audio signal;

a distribution device which divides and distributes the audio signal to said first and second output devices; and a low-frequency-removal device which removes the low-frequency characteristic of a first audio signal that was distributed to said first output device based on a first data that was set according to the reproduction capability of said first output device when the adjustment value of said volume-adjustment device is greater than a second adjustment value and said signal level is greater than a first specified value, and removes the low-frequency characteristic of a second audio signal that was distributed to said second output device based on a second data that was set according to the reproduction capability of said second output device, when the adjustment value of said volume-adjustment device is greater than a third adjustment value and said signal level is greater than said first specified value.

* * * * *